(12) United States Patent
Nakashiba

(10) Patent No.: US 8,410,493 B2
(45) Date of Patent: Apr. 2, 2013

(54) SEMICONDUCTOR DEVICE WHICH CAN TRANSMIT ELECTRICAL SIGNALS BETWEEN TWO CIRCUITS

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 285 days.

(21) Appl. No.: 12/722,092

(22) Filed: Mar. 11, 2010

(65) Prior Publication Data

US 2010/0230783 A1    Sep. 16, 2010

(30) Foreign Application Priority Data

Mar. 13, 2009    (JP) .................................. 2009-61276

(51) Int. Cl.
*G01R 15/22* (2006.01)
*G01R 15/24* (2006.01)

(52) U.S. Cl. .............. 257/80; 257/83; 257/531; 438/24; 438/59

(58) Field of Classification Search ................. 438/171, 438/190, 210, 238, 329, 381, 24, 59; 257/531, 257/E21.022, 80, 83; 340/572.1, 572.2, 572.4; 439/66, 950
See application file for complete search history.

(56) References Cited

U.S. PATENT DOCUMENTS

| | | | | |
|---|---|---|---|---|
| 5,450,263 A * | 9/1995 | Desaigoudar et al. | ........ | 360/110 |
| 5,949,155 A * | 9/1999 | Tamura et al. | ................ | 307/107 |
| 5,952,849 A | 9/1999 | Haigh | | |
| 6,002,161 A * | 12/1999 | Yamazaki | ...................... | 257/531 |
| 6,355,535 B2 * | 3/2002 | Liou | .............................. | 438/381 |
| 6,426,267 B2 * | 7/2002 | Liou | .............................. | 438/319 |
| 6,612,852 B1 * | 9/2003 | Panella | ............................ | 439/70 |
| 6,664,882 B2 * | 12/2003 | Andoh et al. | ................. | 336/200 |
| 6,864,509 B2 * | 3/2005 | Worley | ........................... | 257/80 |
| 6,967,555 B2 * | 11/2005 | Yu et al. | ........................ | 336/200 |
| 6,972,658 B1 * | 12/2005 | Findley et al. | ................ | 336/200 |
| 7,039,381 B2 * | 5/2006 | Yang et al. | ..................... | 455/292 |
| 7,064,645 B2 * | 6/2006 | Kobayashi et al. | ........... | 336/200 |
| 7,091,814 B2 * | 8/2006 | Kyriazidou | ................... | 336/200 |
| 7,235,804 B2 * | 6/2007 | Aki | .............................. | 250/551 |
| 7,262,681 B2 * | 8/2007 | Hurley | .......................... | 336/200 |
| 7,397,107 B2 * | 7/2008 | Brennan et al. | ............... | 257/532 |
| 7,525,407 B2 * | 4/2009 | Lee et al. | ...................... | 336/200 |
| 7,564,319 B2 * | 7/2009 | Ding et al. | .................... | 331/181 |
| 7,612,321 B2 * | 11/2009 | Tsao | ......................... | 250/208.3 |
| 7,619,296 B2 * | 11/2009 | Nakashiba | .................... | 257/531 |
| 7,656,264 B2 * | 2/2010 | Hsu et al. | ..................... | 336/223 |

(Continued)

FOREIGN PATENT DOCUMENTS

| | | |
|---|---|---|
| JP | 2001-513276 | 8/2001 |
| JP | 2008-283172 | 11/2008 |

(Continued)

*Primary Examiner* — Matthew Landau
*Assistant Examiner* — Maliheh Malek
(74) *Attorney, Agent, or Firm* — Young & Thompson

(57) ABSTRACT

A semiconductor device sends and receives electrical signals. The semiconductor device includes a first substrate provided with a first circuit region containing a first circuit; a multi-level interconnect structure provided on the first substrate; a first inductor provided in the multi-level interconnect structure so as to include the first circuit region; and a second inductor provided in the multi-level interconnect structure so as to include the first circuit region, wherein one of the first inductor and the second inductor is connected to the first circuit and the other of the first inductor and the second inductor is connected to a second circuit.

14 Claims, 8 Drawing Sheets

U.S. PATENT DOCUMENTS

| | | | |
|---|---|---|---|
| 7,710,270 B2* | 5/2010 | Shionoiri et al. | 340/572.1 |
| 7,721,414 B2* | 5/2010 | Sia et al. | 29/602.1 |
| 7,768,849 B2* | 8/2010 | Choi | 365/201 |
| 7,772,081 B2* | 8/2010 | Lin et al. | 438/393 |
| 7,795,700 B2* | 9/2010 | Rofougaran | 257/531 |
| 7,936,245 B2* | 5/2011 | Huang et al. | 336/200 |
| 7,981,757 B2* | 7/2011 | Burke et al. | 438/381 |
| 8,004,062 B2* | 8/2011 | Nakashiba | 257/531 |
| 8,018,026 B2* | 9/2011 | Nakashiba | 257/531 |
| 8,041,227 B2* | 10/2011 | Holcombe et al. | 398/138 |
| 8,125,059 B2* | 2/2012 | Ito et al. | 257/660 |
| 2003/0202331 A1* | 10/2003 | Jessie et al. | 361/764 |
| 2004/0075521 A1* | 4/2004 | Yu et al. | 336/200 |
| 2004/0087140 A1* | 5/2004 | Kordic et al. | 438/645 |
| 2004/0217839 A1* | 11/2004 | Haaren et al. | 336/200 |
| 2005/0195061 A1* | 9/2005 | Terrovitis | 336/200 |
| 2006/0151851 A1* | 7/2006 | Pillai et al. | 257/531 |
| 2006/0157798 A1* | 7/2006 | Hayashi et al. | 257/374 |
| 2006/0170072 A1* | 8/2006 | Nakashiba | 257/531 |
| 2006/0181386 A1* | 8/2006 | Lee et al. | 336/200 |
| 2007/0229281 A1* | 10/2007 | Shionoiri et al. | 340/572.7 |
| 2008/0042236 A1* | 2/2008 | Seah Teo Leng | 257/531 |
| 2008/0074229 A1* | 3/2008 | Moinian et al. | 336/200 |
| 2008/0188096 A1* | 8/2008 | Sukegawa et al. | 439/66 |
| 2008/0252531 A1 | 10/2008 | Hanaoka et al. | |
| 2008/0259669 A1* | 10/2008 | Choi | 365/51 |
| 2008/0315356 A1* | 12/2008 | Reisner | 257/531 |
| 2009/0066457 A1* | 3/2009 | Uchida | 336/188 |
| 2009/0072248 A1* | 3/2009 | Im et al. | 257/80 |
| 2009/0135079 A1* | 5/2009 | Dokai et al. | 343/850 |
| 2009/0189745 A1* | 7/2009 | Nakashiba | 340/286.01 |
| 2009/0194768 A1* | 8/2009 | Leedy | 257/48 |
| 2009/0195335 A1* | 8/2009 | Wahl et al. | 333/24 R |
| 2009/0212390 A1* | 8/2009 | Rofougaran | 257/531 |
| 2009/0212391 A1* | 8/2009 | Carobolante et al. | 257/531 |
| 2009/0218657 A1* | 9/2009 | Rofougaran | 257/531 |
| 2009/0233546 A1* | 9/2009 | Sasaki et al. | 455/41.1 |
| 2009/0244866 A1* | 10/2009 | Kawano et al. | 361/765 |
| 2009/0267084 A1* | 10/2009 | Bilger et al. | 257/80 |
| 2009/0315142 A1* | 12/2009 | Burke et al. | 257/528 |
| 2010/0006978 A1* | 1/2010 | Nakashiba | 257/531 |
| 2010/0021176 A1* | 1/2010 | Holcombe et al. | 398/115 |
| 2010/0033239 A1* | 2/2010 | Nakagawa et al. | 327/565 |
| 2010/0052096 A1* | 3/2010 | Urakawa | 257/531 |
| 2010/0178018 A1* | 7/2010 | Augusto | 385/131 |
| 2010/0230785 A1* | 9/2010 | Rofougaran | 257/531 |
| 2010/0264515 A1* | 10/2010 | Nakashiba | 257/531 |
| 2010/0265024 A1* | 10/2010 | Nakashiba | 336/200 |
| 2010/0270642 A1* | 10/2010 | Furumiya et al. | 257/531 |
| 2010/0277995 A1* | 11/2010 | Choi | 365/201 |
| 2010/0328044 A1* | 12/2010 | Waffenschmidt et al. | 340/10.4 |
| 2011/0012228 A1* | 1/2011 | Nakagawa et al. | 257/531 |
| 2011/0049693 A1* | 3/2011 | Nakashiba et al. | 257/676 |
| 2011/0057291 A1* | 3/2011 | Slupsky et al. | 257/531 |
| 2011/0073988 A1* | 3/2011 | Burke et al. | 257/531 |
| 2011/0278696 A1* | 11/2011 | Nakashiba | 257/531 |

FOREIGN PATENT DOCUMENTS

| | | |
|---|---|---|
| WO | WO2004/112138 | 12/2004 |

* cited by examiner

SEMICONDUCTOR DEVICE WHICH CAN TRANSMIT ELECTRICAL SIGNALS BETWEEN TWO CIRCUITS

The present application is based on Japanese Patent Application No. 2009-061276.

BACKGROUND OF THE INVENTION

1. Field of the Invention

The present invention relates to a semiconductor device which can transmit electrical signals between two circuits whose input electrical signals differ in electrical potential.

2. Description of the Related Art

A photocoupler is often used to transmit electrical signals between two circuits whose input electrical signals differ in electrical potential. The photocoupler has a light emitting element such as a light emitting diode and a light receiving element such as a phototransistor. Thus, the photocoupler converts an inputted electrical signal into light using the light emitting element, reconverts the light into an electrical signal using the light receiving element, and thereby transmits the electrical signal.

However, the photocoupler, which has a light emitting element and light receiving element, is difficult to downsize. Also, the photocoupler cannot follow high-frequency electrical signals. To solve these problems, a technique which transmits an electrical signal by inductively coupling two inductors has been developed, such as described in National Publication of International Patent Application No. 2001-513276.

Also, Japanese Patent Laid-Open No. 2008-283172 and International Publication No. 2004-112138 describe a technique which involves placing a circuit inside an inductor when seen in planar view, where the inductor is used as an antenna.

However, the present inventor has newly noticed the following problem. To downsize elements which transmit electrical signals between two circuits whose input electrical signals differ in electrical potential, it is conceivable to form inductors in interconnect layers using manufacturing technology for semiconductor device and placing the inductors face to face to each other. When two inductors in a semiconductor device are inductively coupled in this way to transmit electrical signals, the installation of the two inductors may increase the size of the semiconductor device.

SUMMARY OF THE INVENTION

The present invention provides a semiconductor device comprising: a first substrate provided with a first circuit region containing a first circuit; a multi-level interconnect structure provided on the first substrate; a first inductor provided in the multi-level interconnect structure so as to include the first circuit region; and a second inductor provided in the multi-level interconnect structure so as to include the first circuit region, wherein one of the first inductor and the second inductor is connected to the first circuit and the other of the first inductor and the second inductor is connected to a second circuit.

Since electrical signals can be sent and received using the first inductor and second inductor provided in the multi-level interconnect structure in such a way as to include the first circuit region, the present invention can limit increases in the size of the semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF PREFERRED EMBODIMENTS

Figure 1:
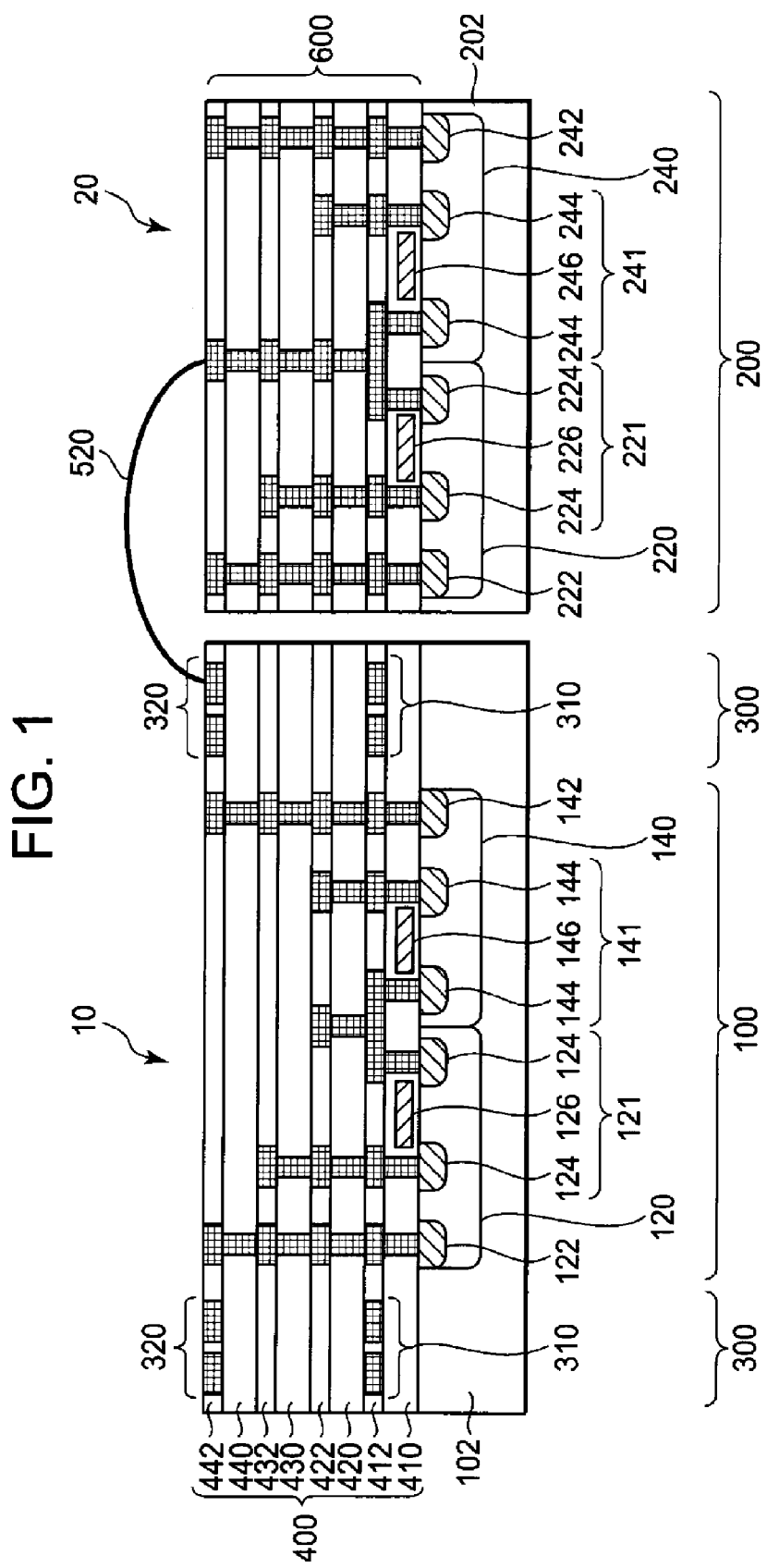
FIG. 1 is a sectional view illustrating a configuration of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described below with reference to the drawings, throughout which similar components are denoted by the same reference numerals, and description thereof will be omitted as required.

First Embodiment

FIG. 1 is a sectional view illustrating a configuration of a semiconductor device according to a first embodiment. The semiconductor device has a first semiconductor chip 10. The first semiconductor chip 10 includes a first substrate 102, first circuit 100, multi-level interconnect structure 400, first inductor 310 (transmitting inductor), and second inductor 320 (receiving inductor). The first substrate 102 is a semiconductor substrate such as a silicon substrate. The first circuit 100 is formed on the first substrate 102. The multi-level interconnect structure 400 is formed on the first substrate 102. The first inductor 310 is formed in the multi-level interconnect structure 400 and wound up in a plane parallel to the first substrate 102. The second inductor 320 is formed in the multi-level interconnect structure 400, wound up in a plane parallel to the first substrate 102, and superimposed on the first inductor 310 when seen in planar view. The first circuit 100 is connected to one of the first inductor 310 and second inductor 320. When seen in planar view, at least part of the first circuit 100 is located inside the first inductor 310 and second inductor 320.

The first inductor 310 and second inductor 320 make up a signal transmission device 300. By being inductively coupled to each other, the first inductor 310 and second inductor 320 transmit electrical signals to each other. The electrical signals, for example, are digital signals, but may be analog signals.

According to the present embodiment, the first inductor 310 is connected to the first circuit 100 while the second inductor 320 is connected to a second semiconductor chip 20. The first circuit 100 is a transmit circuit. That is, the first inductor 310 functions as a transmitting inductor and the second inductor 320 functions as a receiving inductor. For example, bonding wires 520 are used to connect the second inductor 320 and second semiconductor chip 20. The second semiconductor chip 20 includes a second substrate 202, second circuit 200, and multi-level interconnect structure 600. The second circuit 200 includes a receive circuit and is connected to the second inductor 320 via the multi-level interconnect structure 600 and bonding wires 520.

Figure 2:
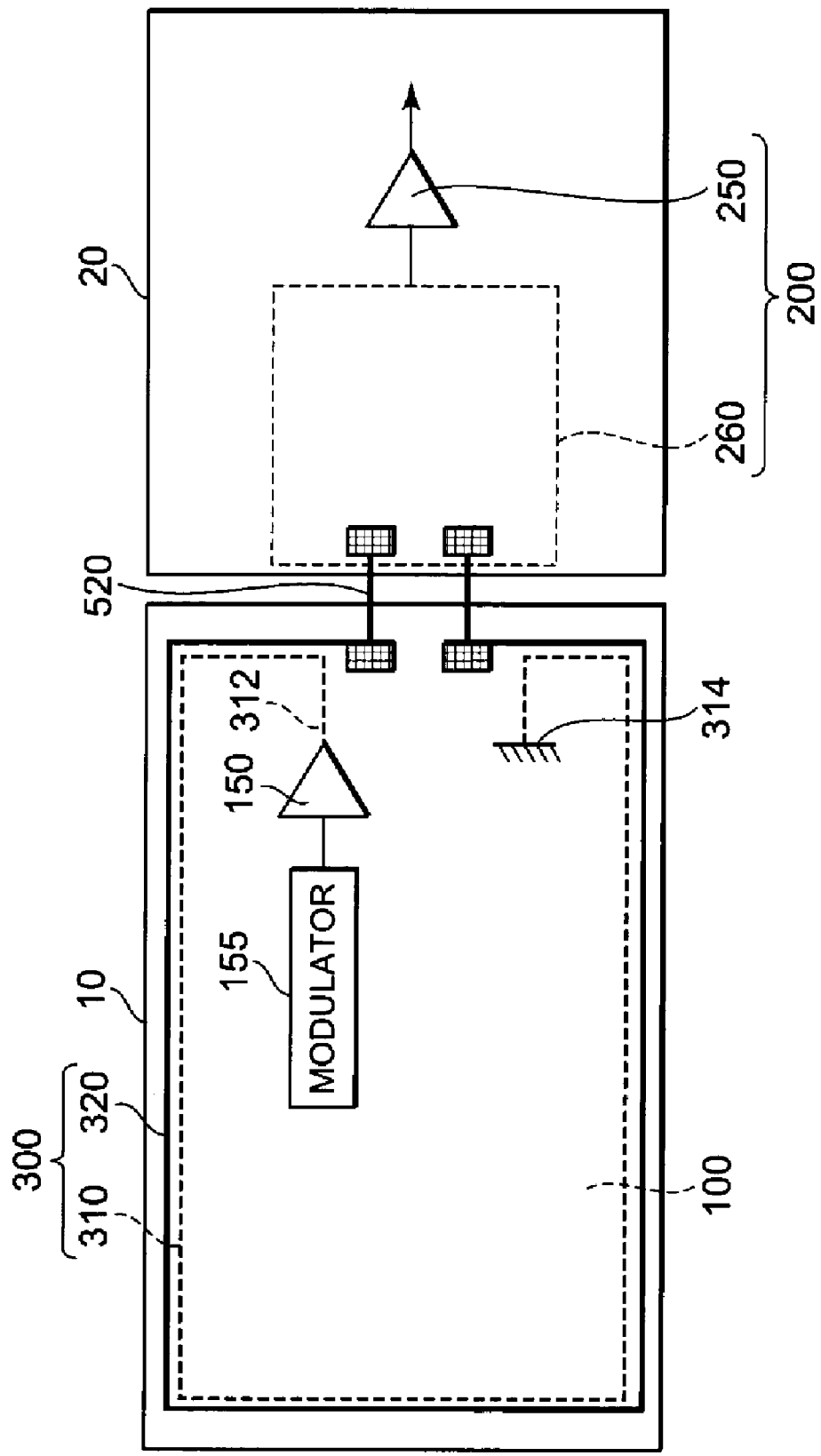
FIG. 2 is a schematic plan view of the semiconductor device illustrated in FIG. 1.

As illustrated in FIG. 2, the first circuit 100 includes a modulator 155 which modulates digital signals into transmit signals and a transmit driver circuit 150 which outputs the modulated signals to the first inductor 310. The second circuit 200 includes a receive circuit 260 connected to the second inductor 320 as well as includes a receive driver circuit 250 (e.g., gate driver). The receive circuit 260 demodulates the modulated signals into digital signals. The receive circuit 260 outputs the resulting digital signals to the receive driver circuit 250.

The first circuit 100 and second circuit 200 differ from each other in the electrical potential of inputted electrical signals, but since the first inductor 310 and second inductor 320 send and receive electrical signals using inductive coupling, the first circuit 100 and second circuit 200 do not encounter any problem. Incidentally, in the configuration illustrated in FIG. 1, possible cases in which "inputted electrical signals differ from each other in electrical potential" include a case in which the electrical signals differ from each other in amplitude (electrical potential represented by 0 and electrical potential represented by 1), a case in which the electrical signals differ from each other in reference voltage (electrical potential represented by 0), and a case in which the electrical signals differ from each other in both amplitude and reference voltage.

The first circuit 100 of the first semiconductor chip 10 has first transistors. The first transistors include a first-conductivity type transistor and second-conductivity type transistor. The first-conductivity type first transistor 121 is formed in a second-conductivity type well 120 and has two first-conductivity type doped regions 124 and a gate electrode 126, where the first-conductivity type doped regions 124 serve as a source and drain. The second-conductivity type first transistor 141 is formed in a first-conductivity type well 140 and has two second-conductivity type doped regions 144 and a gate electrode 146, where the second-conductivity type doped regions 144 serve as a source and drain. A gate insulating film is formed under each of the gate electrodes 126 and 146. The two gate insulating films are approximately equal in thickness. The first transistors 121 and 141 make up the transmit driver circuit, which is, for example, an inverter.

A second-conductivity type doped region 122 is formed in the well 120 and a first-conductivity type doped region 142 is formed in the well 140. The doped region 122 is connected with a wire which gives a reference voltage (ground potential) for the first-conductivity type first transistor 121 and the doped region 142 is connected with a wire which gives a reference voltage for the second-conductivity type first transistor 141.

The second circuit 200 of the second semiconductor chip 20 has second transistors. The second transistors also include a first-conductivity type transistor and second-conductivity type transistor. The first-conductivity type second transistor 221 is formed in a second-conductivity type well 220 and has two first-conductivity type doped regions 224 and a gate electrode 226, where the first-conductivity type doped regions 224 serve as a source and drain. The second-conductivity type second transistor 241 is formed in a first-conductivity type well 240 and has two second-conductivity type doped regions 244 and a gate electrode 246, where the second-conductivity type doped regions 244 serve as a source and drain. A gate insulating film is formed under each of the gate electrodes 226 and 246. The second transistors 221 and 241 make up the receive driver circuit 250 and receive circuit 260.

A second-conductivity type doped region 222 is formed in the well 220 and a first-conductivity type doped region 242 is formed in the well 240. The doped region 222 is connected with a wire which gives a reference voltage for the first-conductivity type second transistor 221 and the doped region 242 is connected with a wire which gives a reference voltage for the second-conductivity type second transistor 241.

In the example illustrated in FIG. 1, the gate insulating films differ in thickness between the first transistors (121 and 141) and second transistors (221 and 241), but may have the same thickness.

According to the present embodiment, the first inductor 310 and second inductor 320 are spiral wiring patterns formed in different interconnect layers. The first inductor 310 is located, for example, in the lowermost interconnect layer 412 and the second inductor 320 is located, for example, in the uppermost interconnect layer 442.

When seen in planar view, the first circuit 100 fits entirely in the space occupied by the first inductor 310 and second inductor 320. The spacing between the first inductor 310 and second inductor 320 is smaller than the diameter of the first inductor 310 and diameter of the second inductor 320. This makes it easier to inductively couple the first inductor 310 and second inductor 320.

The multi-level interconnect structure 400 is formed by alternately stacking an insulation layer and interconnect layer in this order t times ($t \geq 3$) each. The first inductor 310 is provided in the nth interconnect layer of the multi-level interconnect structure 400. The second inductor 320 is provided in the mth interconnect layer ($t \geq m \geq n+2$) of the multi-level interconnect structure 400 and located above the first inductor 310. That is, the first inductor 310 and second inductor 320 are formed in different interconnect layers. No inductor is provided in any interconnect layer between the nth interconnect layer and mth interconnect layer, i.e., between the first inductor 310 and second inductor 320. According to the present embodiment, the multi-level interconnect structure 400 is formed by stacking an insulation layer 410, the interconnect layer 412, an insulation layer 420, an interconnect layer 422, an insulation layer 430, an interconnect layer 432, an insulation layer 440, and the interconnect layer 442 in this order. Each of the insulation layers 410, 420, 430, and 440 may be a stack of multiple insulating films or a single insulating film.

The wires used for the interconnect layers 412, 422, 432, and 442 are Cu wires formed by the Damascene process and are buried in grooves formed in the interconnect layers 412, 422, 432, and 442, respectively. Pads (not shown) are formed on the uppermost interconnect layer. Incidentally, at least one of the interconnect layers 412, 422, 432, and 442 may be made of Al alloy wires. The wires formed in the interconnect layers 412, 422, 432, and 442 are interconnected via plugs buried in the insulation layers 410, 420, 430, and 440.

The insulating films in the insulation layers and interconnect layers may be $SiO_2$ films or low-dielectric films. The low-dielectric films may have a relative dielectric constant of 3.3 or below, and preferably 2.9 or below. In addition to SiOC, possible material of the low-dielectric films include hydrogen polysiloxanes such as HSQ (hydrogen silsesquioxane), MSQ (methyl silsesquioxane), and MHSQ (methylated hydrogen silsesquioxane); aromatic organic materials such as polyarylether (PAE), divinyl siloxane-bis-benzocyclobutene (BCB), and Silk (registered trademark); SOG; FOX (flowable oxide); Cytop; and BCB (Bensocyclobutene). Also, porous films of the materials listed above may be used as the low-dielectric films.

FIG. 2 is a schematic plan view of the semiconductor device illustrated in FIG. 1. As described above, the first circuit 100 is located inside the first inductor 310 and second inductor 320 when seen in planar view. The first circuit 100 includes the transmit driver 150. At least part of the transmit driver 150 (for example, an inverter) is made up of the first transistors 121 and 141 as described above. The transmit driver 150 is connected with one end 312 of the first inductor 310. The other end 314 of the first inductor 310 is connected to a power wire or ground wire.

Next, a manufacturing method of the first semiconductor chip 10 will be described. To begin with, the first circuit 100 is formed on the first substrate 102. Then, the multi-level interconnect structure 400 is formed on the first substrate 102. When the multi-level interconnect structure 400 is formed, the first inductor 310 and second inductor 320 are formed as well. Also, the first inductor 310 is connected to the first circuit 100 via wiring in the multi-level interconnect structure 400.

Next, operation and advantages of the present embodiment will be described. Inductor requires a relatively large area (e.g., a diameter of 500 µm). Consequently, the first inductor 310 and second inductor 320, when installed in the first semiconductor chip 10 to transmit electrical signals, tend to increase the size of the first semiconductor chip 10. On the other hand, according to the present embodiment, at least part of the first circuit 100 is located inside the first inductor 310 and second inductor 320 when seen in planar view. This limits increases in the size of the first semiconductor chip 10. This effect is especially pronounced when the first circuit 100 fits entirely in the space occupied by the first inductor 310 and second inductor 320 when seen in planar view.

Also, the spacing between the first inductor 310 and second inductor 320 can be made smaller than the diameter of the first inductor 310 and diameter of the second inductor 320. When the first inductor 310 and second inductor 320 are inductively coupled, preferably the diameter of the first inductor 310 and second inductor 320 is increased and the spacing between the first inductor 310 and second inductor 320 is decreased. Thus, when the spacing between the first inductor 310 and second inductor 320 is made smaller than the diameter of the first inductor 310 and diameter of the second inductor 320 as in the case of the present embodiment, it becomes easier to inductively couple the first inductor 310 and second inductor 320, increasing signal transmission efficiency between the first inductor 310 and second inductor 320.

Second Embodiment

Figure 3:
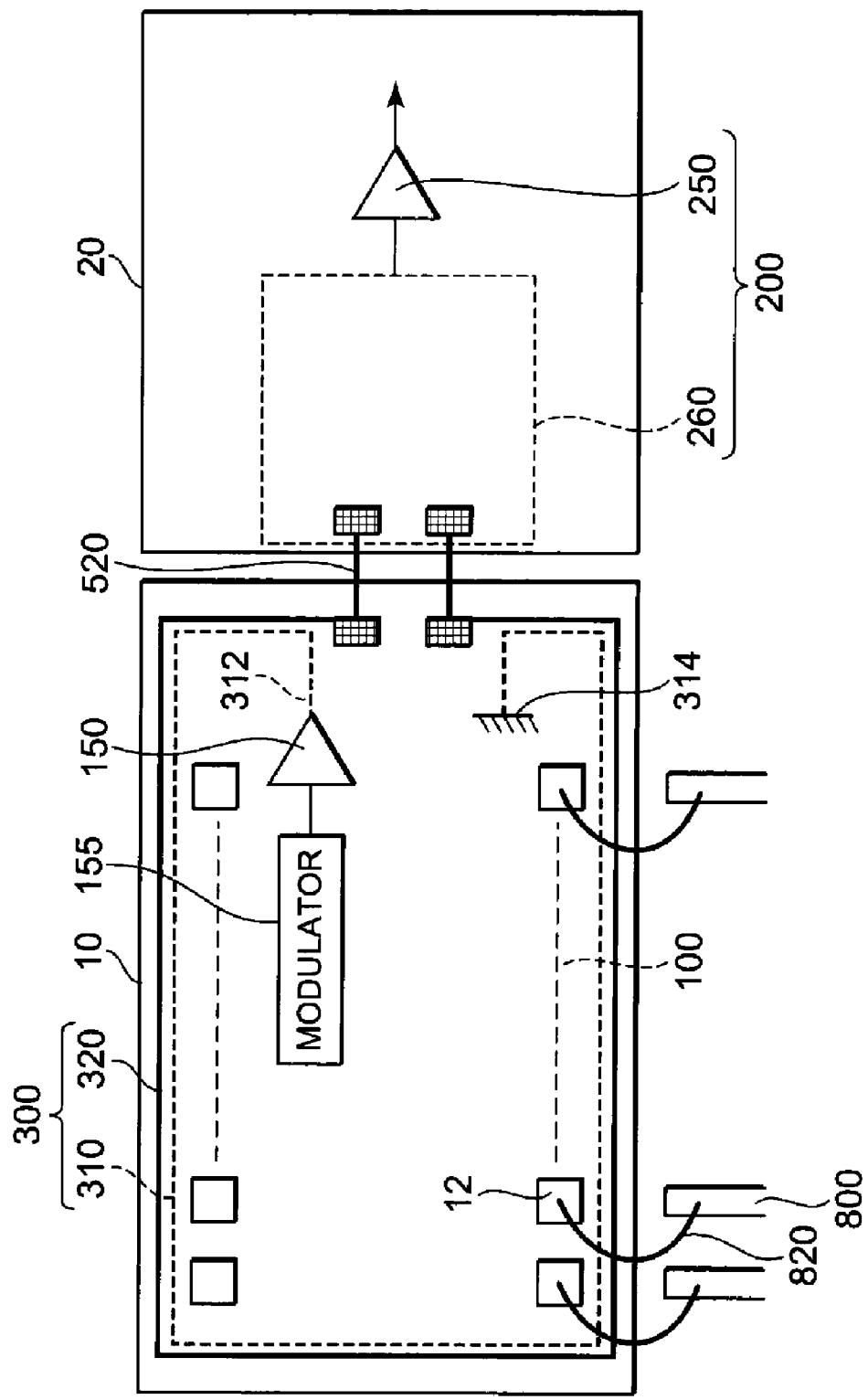
FIG. 3 is a schematic plan view illustrating a configuration of a semiconductor device according to a second embodiment.

FIG. 3 is a schematic plan view illustrating a configuration of a semiconductor device according to a second embodiment and corresponds to FIG. 2 according to the first embodiment. In the semiconductor device, an external terminal (e.g., pad) 12 of the first semiconductor chip 10 is located inside the first inductor 310 and second inductor 320 when seen in planar view. Otherwise, the configuration is the same as in the first embodiment.

The present embodiment provides advantages similar to those of the first embodiment. Also, since the external terminal 12 of the first semiconductor chip 10 is located inside the first inductor 310 and second inductor 320 when seen in planar view, there is no need for wiring to cross the first inductor 310 and second inductor 320 when connecting circuits formed in the first semiconductor chip 10 with the external terminal 12. This makes it easier to route wiring.

Third Embodiment

Figure 4:
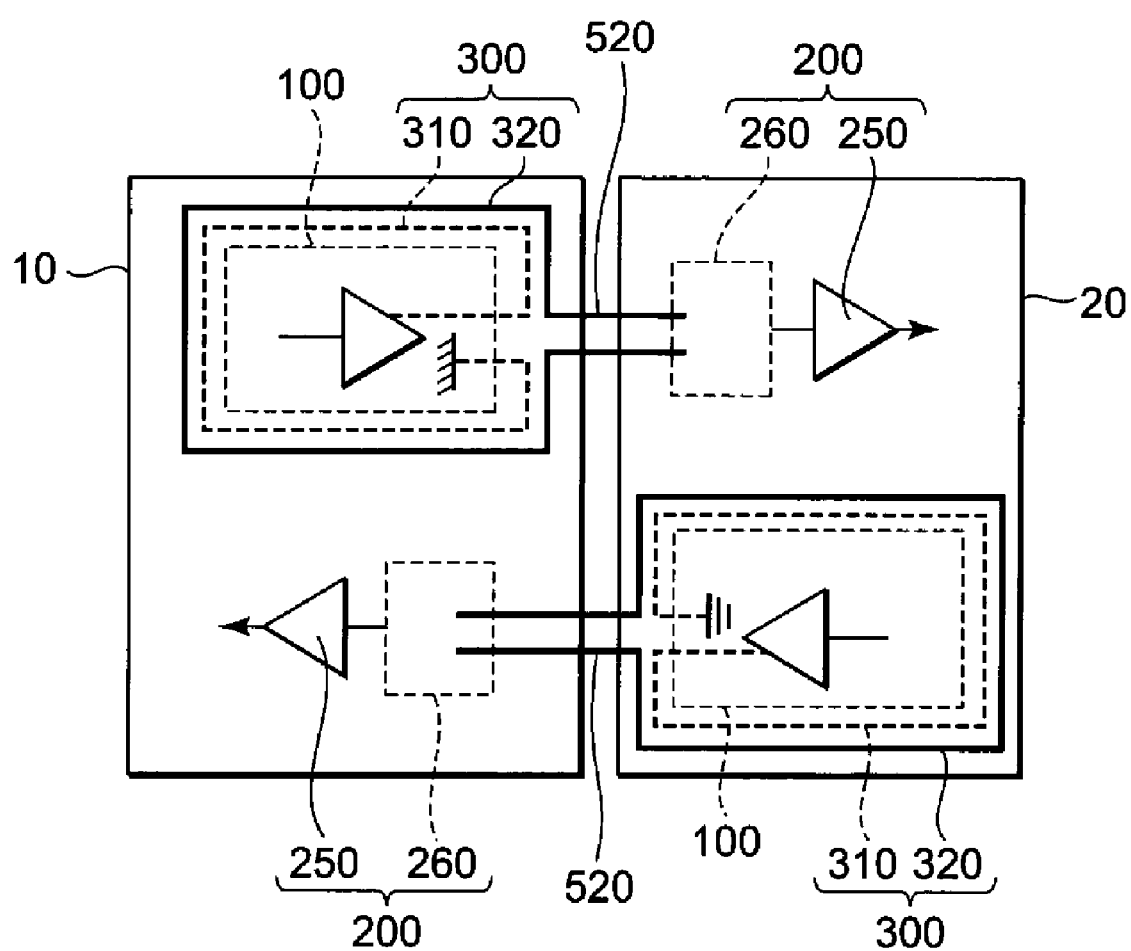
FIG. 4 is a schematic plan view illustrating a configuration of a semiconductor device according to a third embodiment.

FIG. 4 is a schematic plan view illustrating a configuration of a semiconductor device according to a third embodiment. The semiconductor device has the same configuration as the first and second embodiments except that the first semiconductor chip 10 and second semiconductor chip 20 send and receive signals bidirectionally and that the first semiconductor chip 10 and second semiconductor chip 20 each include a first circuit 100, first inductor 310, second inductor 320, and second circuit 200. Incidentally, the modulator 155 illustrated in FIGS. 2 and 3 is omitted from illustration in FIG. 4.

That is, the first circuit 100 of the first semiconductor chip 10 is connected to the second circuit 200 of the second semiconductor chip 20 via the first inductor 310, second inductor 320, and bonding wires 520 of the first semiconductor chip 10. Also, the first circuit 100 of the second semiconductor chip 20 is connected to the second circuit 200 of the first semiconductor chip 10 via the first inductor 310, second inductor 320, and bonding wires 520 of the second semiconductor chip 20.

Figure 5:
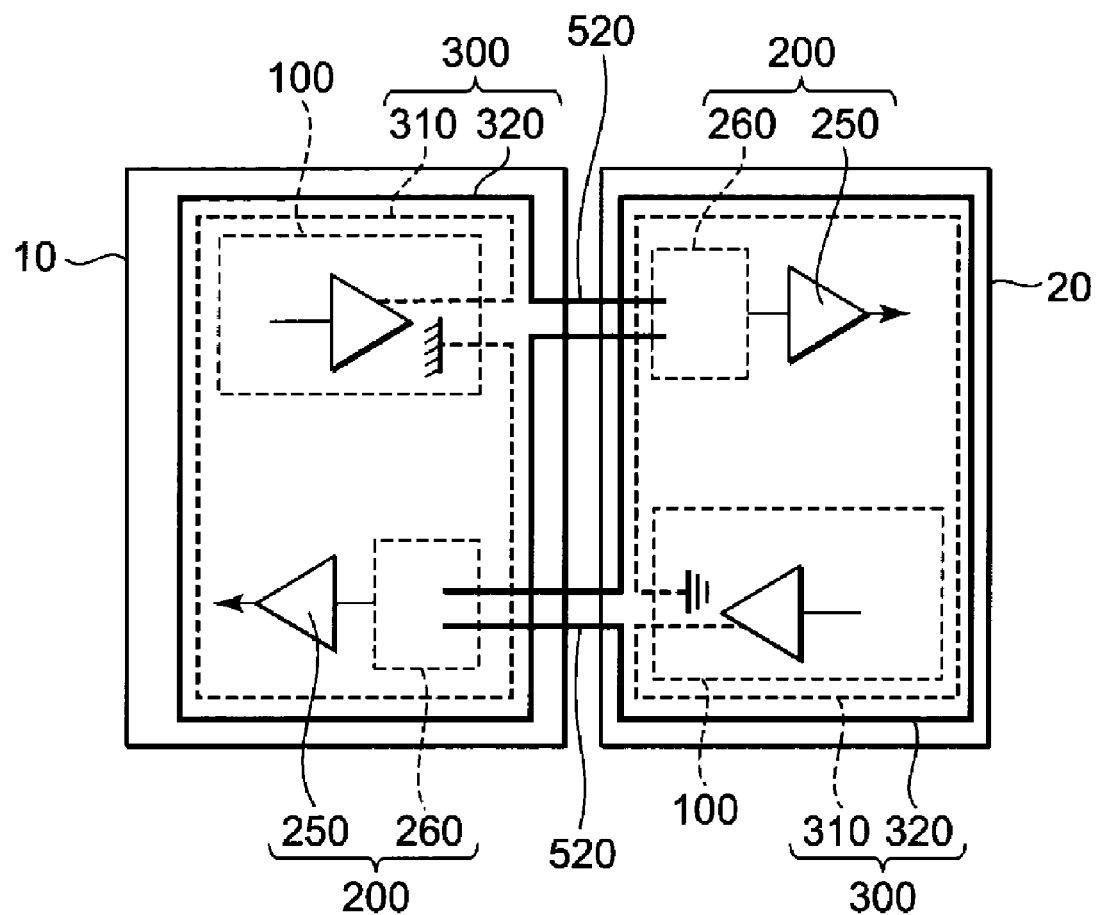
FIG. 5 is a schematic plan view illustrating a configuration of a semiconductor device according to a variation of the semiconductor device in FIG. 4.

The present embodiment also provides advantages similar to those of the first or second embodiment. Incidentally, according to the present embodiment, as illustrated in FIG. 5, in both the first semiconductor chip 10 and second semiconductor chip 20, the first circuit 100 and second circuit 200 may be placed inside the first inductor 310 and second inductor 320 when seen in planar view.

Fourth Embodiment

Figure 6:
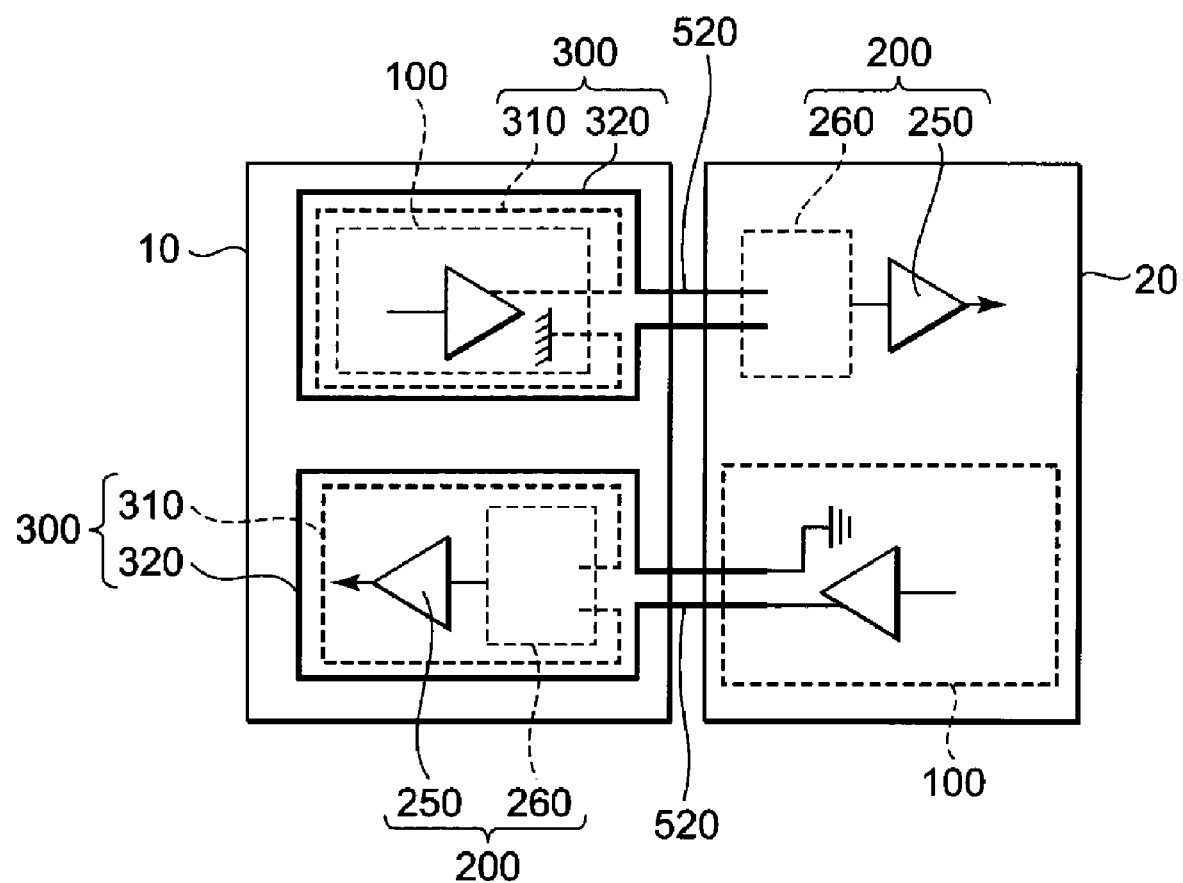
FIG. 6 is a schematic plan view illustrating a configuration of a semiconductor device according to a fourth embodiment.

FIG. 6 is a schematic plan view illustrating a configuration of a semiconductor device according to a fourth embodiment. The semiconductor device has the same configuration as the third embodiment except that two pairs of the first inductor 310 and second inductor 320 are both formed on the first semiconductor chip 10. The modulator 155 is omitted from illustration in FIG. 6.

The second circuit 200 of the first semiconductor chip 10 is connected with the first inductor 310 as a receiving inductor. When seen in planar view, at least part of, and preferably all of, the second circuit 200 is located inside the first inductor 310 and the second inductor 320 inductively coupled with the first inductor 310.

The present embodiment also provides advantages similar to those of the third embodiment.

Fifth Embodiment

Figure 7:
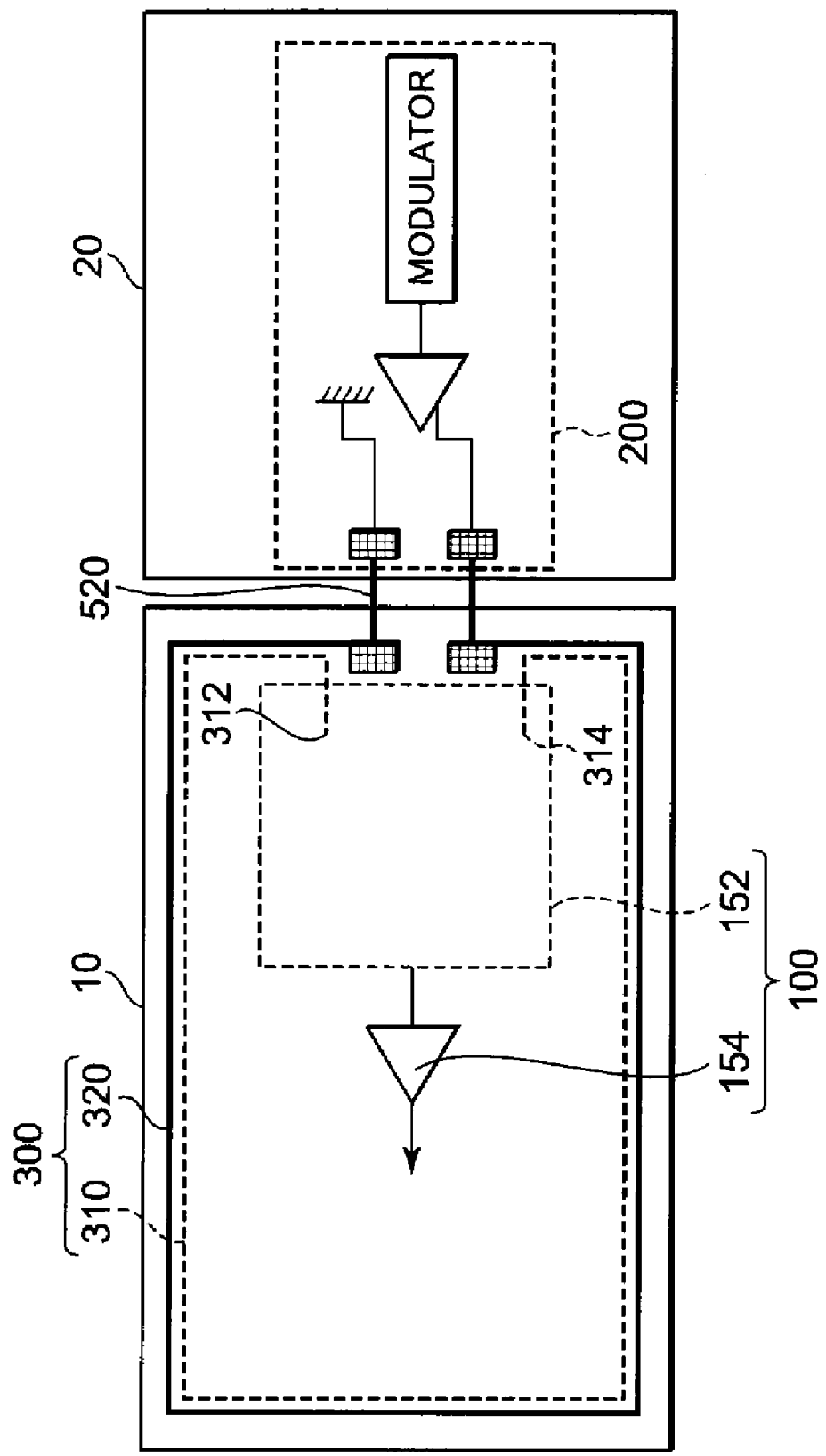
FIG. 7 is a schematic plan view illustrating a configuration of a semiconductor device according to a fifth embodiment.

FIG. 7 is a schematic plan view illustrating a configuration of a semiconductor device according to a fifth embodiment and corresponds to FIG. 2 according to the first embodiment. The semiconductor device has the same configuration as the semiconductor device according to the first embodiment except that the first circuit 100 includes a receive circuit 152 and a receive driver circuit 154 (e.g., gate driver) and that the second circuit 200 is a transmit circuit. According to the present embodiment, the second inductor 320 functions as a transmitting inductor and the first inductor 310 functions as a receiving inductor.

The second circuit 200 includes a modulator which modulates digital signals into transmit signals and a transmit driver circuit which outputs the modulated signals to the second inductor 320. The receive circuit 152 of the first circuit 100 demodulates the modulated signals into digital signals. The receive circuit 152 outputs the resulting digital signals to the receive driver circuit 154.

The receive driver circuit 154 includes the first transistors 121 and 141, which are the same as those illustrated in FIG. 1 according to the first embodiment. The first transistors 121 and 141 make up an inverter.

The present embodiment also provides advantages similar to those of the first embodiment.

Sixth Embodiment

Figure 8:
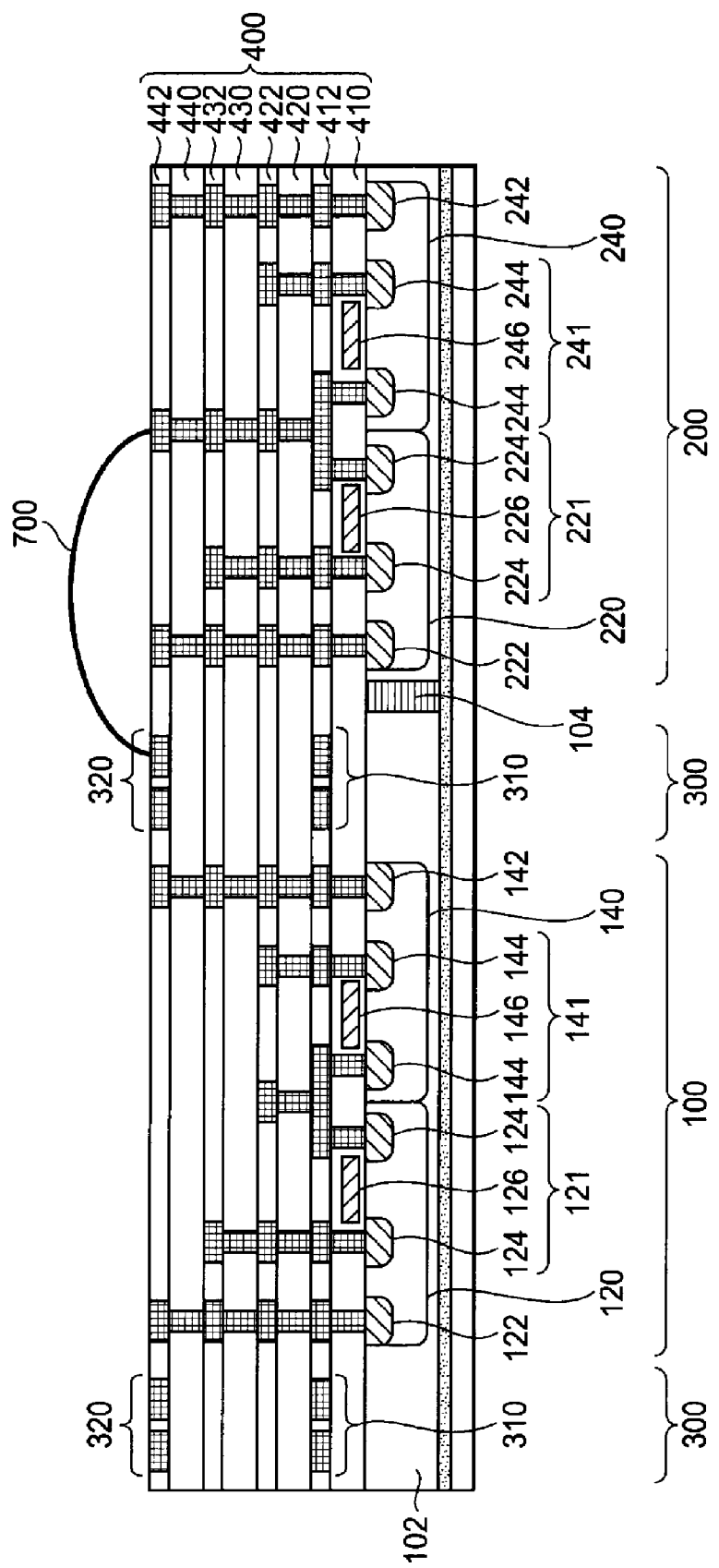
FIG. 8 is a sectional view illustrating a configuration of a semiconductor device according to a sixth embodiment.

FIG. 8 is a sectional view illustrating a configuration of a semiconductor device according to a sixth embodiment. The semiconductor device has the same configuration as the semiconductor device according to any of the first to fifth embodiments except that the first substrate 102 is an SOI (Silicon On Insulator) substrate and that the second circuit 200 is formed on the first substrate 102. That is, whereas according to the first to fifth embodiments, the semiconductor device is implemented on two semiconductor chips, according to the present embodiment, the semiconductor device is implemented on a single semiconductor chip.

A device isolation film 104 is buried in a silicon layer of the first substrate 102. A lower end of the device isolation film 104 reaches an insulation layer of the first substrate 102. The device isolation film 104 insulates the first circuit 100 and second circuit 200 from each other. This prevents the first circuit 100 and second circuit 200 from affecting each other even if they differ in reference voltage.

The present embodiment also provides advantages similar to those of the first to fifth embodiments. In addition, the first circuit 100 and second circuit 200 can be formed in a single semiconductor chip.

It should be noted that embodiments described above with reference to the drawings are only exemplary of the present invention and that various configurations other than those described above can be adopted according to the present invention. For example, the first inductor 310 and second inductor 320 may be placed in such a way as not to overlap when seen in planar view. In that case, the first inductor 310 and second inductor 320 may be formed in the same interconnect layer. Alternatively, a half of one inductor may overlap the other inductor and the remaining half may be placed without overlapping the other inductor.

It is apparent that the present invention is not limited to the above embodiments, but may be modified and changed without departing from the scope and spirit of the invention.

What is claimed is:

1. A semiconductor device comprising:
a first substrate;
a second substrate;
a multi-level interconnect structure provided over the first substrate;
a first inductor provided in the multi-level interconnect structure so as to surround all transistors provided over the first substrate in a plan view; and
a second inductor provided in the multi-level interconnect structure so as to surround all the transistors provided over the first substrate in the plan view,
wherein the second inductor is provided over the first inductor,
wherein the first substrate is provided with a first circuit region containing a first circuit,
wherein the second substrate is provided with a second circuit region containing a second circuit,
wherein the first inductor is provided in the multi-level interconnect structure so as to include the first circuit region,
wherein the second inductor is provided in the multi-level interconnect structure so as to include the first circuit region, and
wherein one of the first inductor and the second inductor is connected to the first circuit, and the other of the first inductor and the second inductor is connected to the second circuit.

2. The semiconductor device according to claim 1, wherein the first inductor and the second inductor differ from each other in reference voltage.

3. The semiconductor device according to claim 1,
wherein the multi-level interconnect structure includes a first interconnect layer, an insulation layer placed on the first interconnect layer, and a second interconnect layer placed on the insulation layer,
wherein the first inductor is provided on the first interconnect layer, and
wherein the second inductor is provided on the second interconnect layer.

4. The semiconductor device according to claim 1, wherein the first inductor and the second inductor overlap each other in the plan view.

5. The semiconductor device according to claim 3, wherein spacing between the first inductor and the second inductor is smaller than diameters of the first inductor and the second inductor.

6. A semiconductor device, comprising:
a first substrate, provided with a first circuit region containing a first circuit;
a second circuit region, on the first substrate, containing a second circuit;
a multi-level interconnect structure provided over the first substrate;
a first inductor provided in the multi-level interconnect structure so as to surround all transistors provided over the first substrate in a plan view; and
a second inductor provided in the multi-level interconnect structure so as to surround all the transistors provided over the first substrate in the plan view,
wherein the second inductor is provided over the first inductor,
wherein the first circuit region and the second circuit region are insulated from each other,
wherein the first inductor is provided in the multi-level interconnect structure so as to include the first circuit region,
wherein the second inductor is provided in the multi-level interconnect structure so as to include the first circuit region, and
wherein one of the first inductor and the second inductor is connected to the first circuit and the other of the first inductor and the second inductor is connected to a second circuit.

7. The semiconductor device according to claim 6, wherein the first circuit is a transmit circuit including a transmit driver circuit connecting to the first inductor.

8. The semiconductor device according to claim 7, wherein one end of the first inductor is connected to the transmit driver circuit and another end of the first inductor is connected to a power wire or a ground wire.

9. The semiconductor device according to claim 6, wherein the second circuit includes a receive circuit and a receive driver circuit.

10. The semiconductor device according to claim 9, further comprising:
wiring which connects the second inductor and the second circuit with each other.

11. The semiconductor device according to claim 10, wherein the first circuit region is located inside an area surrounded by the first inductor and the second inductor.

12. The semiconductor device according to claim 1, further comprising:
pads provided in a top of the multi-level interconnect structure,
wherein all the pads are surrounded by the first inductor and the second inductor in the plan view.

13. The semiconductor device according to claim 12, wherein the pads are connected to the transistors.

14. The semiconductor device according to claim 13, wherein the pads are connected to other regions across the second inductor.

* * * * *